(12) United States Patent
Ono et al.

(10) Patent No.: US 9,793,048 B2
(45) Date of Patent: Oct. 17, 2017

(54) CAPACITOR ARRANGEMENT STRUCTURE

(71) Applicant: HONDA MOTOR CO., LTD., Tokyo (JP)

(72) Inventors: Tomoaki Ono, Wako (JP); Shinnosuke Sato, Wako (JP); Kosuke Nishiyama, Wako (JP); Atsushi Amano, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/367,179

(22) Filed: Dec. 2, 2016

(65) Prior Publication Data
US 2017/0221632 A1 Aug. 3, 2017

(30) Foreign Application Priority Data
Jan. 29, 2016 (JP) .................................. 2016-015059

(51) Int. Cl.
| | |
|---|---|
| *H05K 7/20* | (2006.01) |
| *H01G 2/08* | (2006.01) |
| *H01M 10/42* | (2006.01) |
| *H01G 2/10* | (2006.01) |
| *H01L 23/367* | (2006.01) |

(52) U.S. Cl.
CPC .................. *H01G 2/08* (2013.01); *H01G 2/10* (2013.01); *H01L 23/3675* (2013.01); *H01M 10/4264* (2013.01); *H01M 2010/4271* (2013.01); *H01M 2220/20* (2013.01)

(58) Field of Classification Search
CPC .............................. H01L 23/3675; H01G 2/08

USPC .................................................. 361/689, 702
See application file for complete search history.

(56) References Cited

U.S. PATENT DOCUMENTS

| | | | | |
|---|---|---|---|---|
| 4,000,509 | A * | 12/1976 | Jarvela | H01L 23/3675 257/697 |
| 6,156,980 | A * | 12/2000 | Peugh | H01L 23/3677 174/252 |
| 8,531,024 | B2 * | 9/2013 | Lin | H01L 21/486 257/706 |
| 2006/0043581 | A1* | 3/2006 | Prokofiev | H05K 1/141 257/713 |
| 2007/0284733 | A1* | 12/2007 | Leung | H01L 23/13 257/712 |

(Continued)

FOREIGN PATENT DOCUMENTS

JP 2009-177872 8/2009

*Primary Examiner* — Hung V Ngo
(74) *Attorney, Agent, or Firm* — Mori & Ward, LLP

(57) ABSTRACT

A capacitor arrangement structure includes a casing, a housing, and a heat sink. The casing accommodates a capacitor. The casing includes a casing bottom. The housing includes a bottom wall. The housing has a height from the bottom wall which includes an inner surface and an outer surface opposite to the inner surface in a height direction. The casing is mounted on the inner surface so that the casing bottom opposes a mounting surface in the inner surface. The heat sink includes a heat sink top. The heat sink is provided on the outer surface of the bottom wall not to overlap the casing viewed along the height direction. The heat sink top opposes the outer surface. A distance between the casing bottom and the mounting surface in the height direction is smaller than a distance between the heat sink top and the mounting surface in the height direction.

5 Claims, 3 Drawing Sheets

(56) References Cited

U.S. PATENT DOCUMENTS

| | | | | |
|---|---|---|---|---|
| 2011/0133329 A1* | 6/2011 | Takahashi | ............ | H01L 21/561 257/712 |
| 2011/0149537 A1* | 6/2011 | Kurosawa | ........... | H01L 23/3675 361/760 |
| 2012/0018906 A1* | 1/2012 | Mino | .................... | H01L 21/561 257/789 |
| 2012/0153453 A1* | 6/2012 | Ankireddi | ............... | H01L 23/42 257/712 |
| 2015/0021756 A1* | 1/2015 | Adachi | ................ | H01L 23/473 257/714 |
| 2015/0289357 A1* | 10/2015 | Wakana | ................ | H05K 5/006 174/535 |
| 2016/0027709 A1* | 1/2016 | Okamoto | ................ | H01L 23/08 257/693 |
| 2016/0190034 A1* | 6/2016 | Okamotoa | ............. | H01L 23/13 257/692 |

* cited by examiner

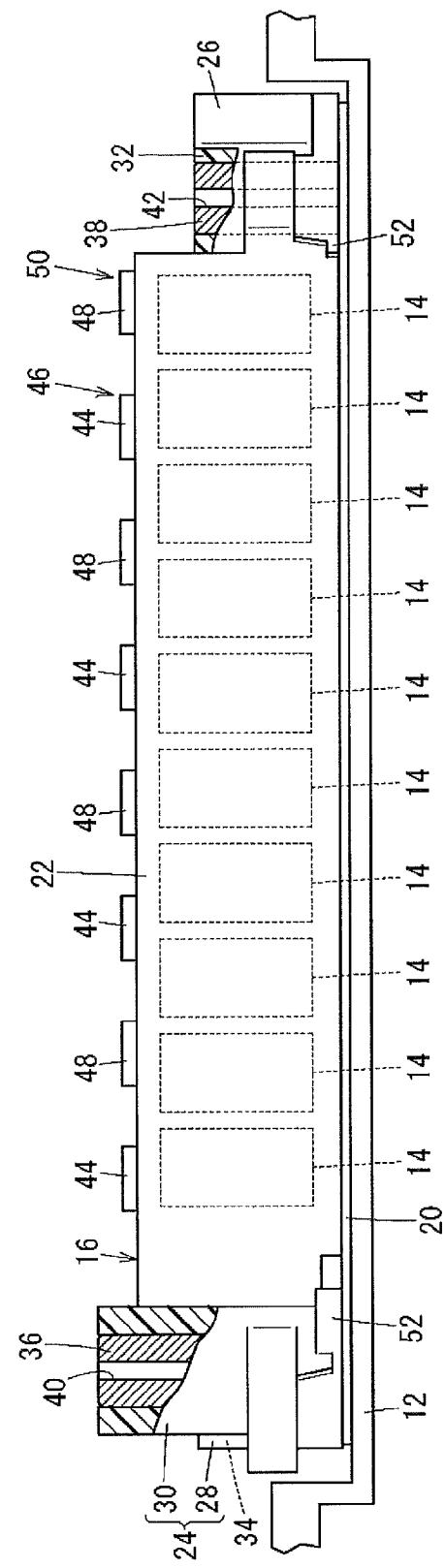

CAPACITOR ARRANGEMENT STRUCTURE

CROSS-REFERENCE TO RELATED APPLICATIONS

The present application claims priority under 35 U.S.C. §119 to Japanese Patent Application No. 2016-015059, filed Jan. 29, 2016. The contents of this application are incorporated herein by reference in their entirety.

BACKGROUND OF THE INVENTION

Field of the Invention

The present invention relates to a capacitor arrangement structure.

Discussion of the Background

For example, a power control unit (PCU) mounted on an automobile has a configuration in which elements such as a capacitor or a reactor are accommodated inside a hollow housing. Here, the elements generate heat when a current flows to the elements. In order to promptly remove and radiate the heat, a heat sink is accommodated inside the housing.

In general, the capacitor is accommodated in the casing to be disposed inside the housing in this state. As illustrated in FIG. 2 of Japanese Patent Application Publication No. 2009-177872 A, the capacitor (the casing) is positioned and fixed onto the heat sink.

SUMMARY OF THE INVENTION

According to one aspect of the present invention, a capacitor arrangement structure includes a casing, a housing, and a heat sink. The casing accommodates a capacitor. The casing includes a casing bottom. The housing includes a bottom wall. The housing has a height from the bottom wall which includes an inner surface and an outer surface opposite to the inner surface in a height direction along the height. The casing is mounted on the inner surface so that the casing bottom opposes a mounting surface in the inner surface. The heat sink includes a heat sink top. The heat sink is provided on the outer surface of the bottom wall not to overlap the casing viewed along the height direction. The heat sink top opposes the outer surface. A distance between the casing bottom and the mounting surface in the height direction is smaller than a distance between the heat sink top and the mounting surface in the height direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 3 is a cross-sectional view schematically illustrating a part of a casing accommodating a capacitor and constituting the PCU of FIG. 1 when viewed from a front side thereof.

DESCRIPTION OF THE EMBODIMENTS

Figure 1:
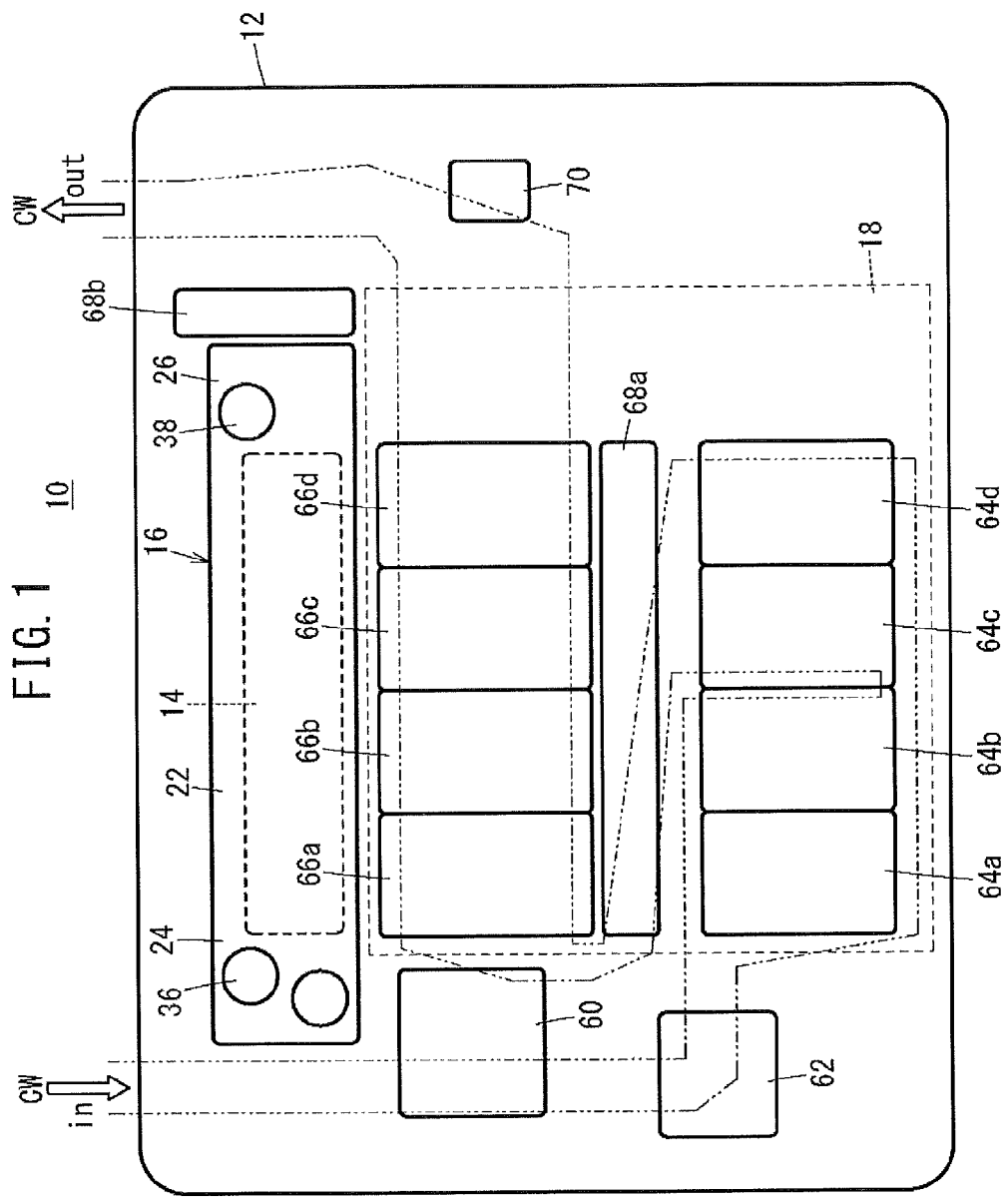
FIG. 1 is a top view schematically illustrating a main part of a power control unit (PCU) employing an arrangement structure according to an embodiment of the invention.

The embodiments will now be described with reference to the accompanying drawings, wherein like reference numerals designate corresponding or identical elements throughout the various drawings.

Hereinafter, a capacitor arrangement structure according to the invention will be described in detail with reference to the accompanying drawings by exemplifying a case in which the capacitor arrangement structure is applied to a power control unit (PCU) including a capacitor.

Figure 2:
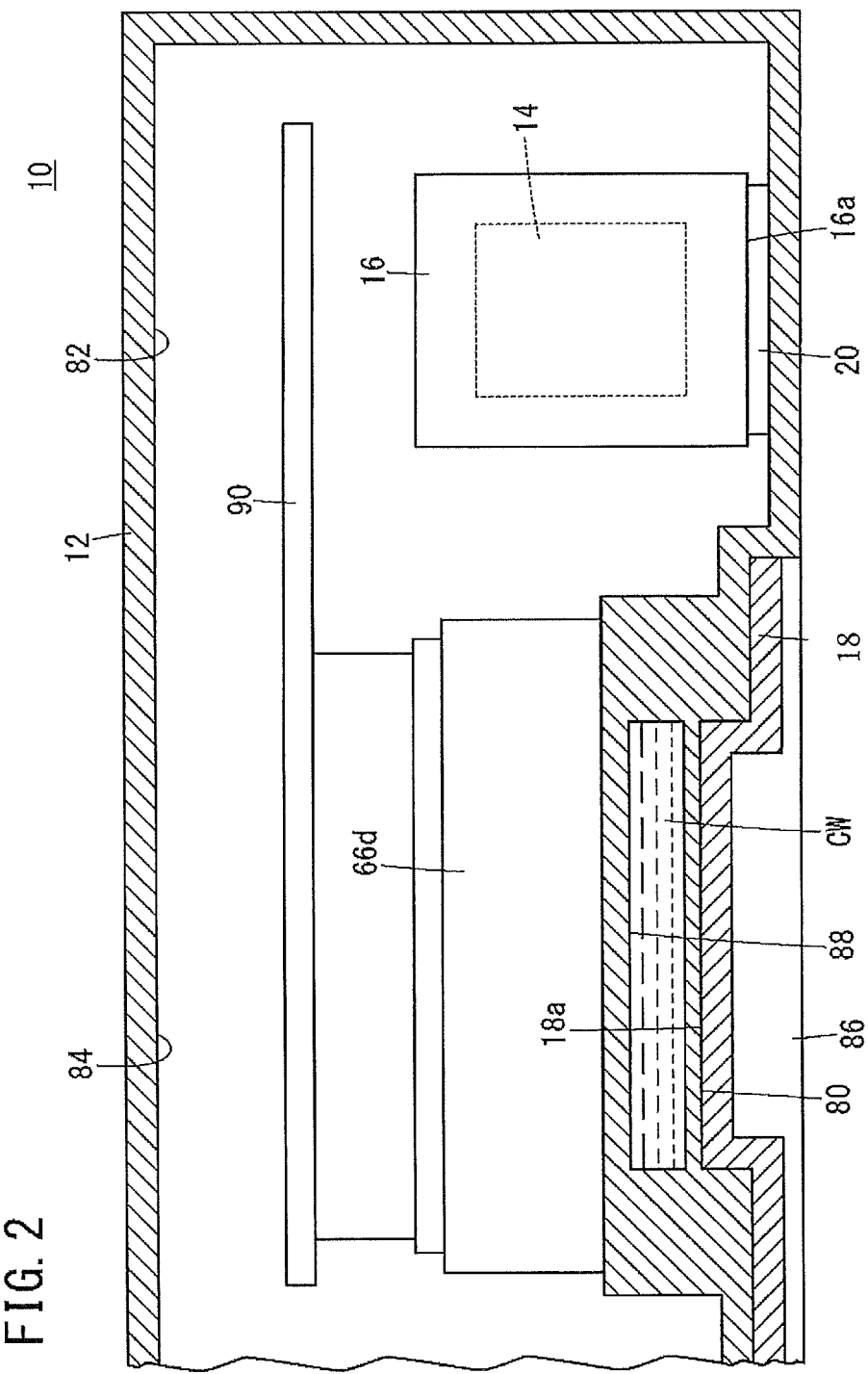
FIG. 2 is a longitudinal-sectional view schematically illustrating a main part of the PCU of FIG. 1.

A top view and a longitudinal-sectional view illustrated in FIGS. 1 and 2 schematically illustrate a main part of a PCU 10 that employs an arrangement structure according to the embodiment. The PCU 10 includes a housing 12, a first casing 16 accommodating a capacitor 14, and a heat sink 18. The first casing 16 is accommodated inside the housing 12 and the heat sink 18 is attached to the housing 12.

First, the capacitor 14 and the first casing 16 will be described with reference to FIG. 3 corresponding to a partial cross-sectional view when these components are viewed from a front side. The first casing 16 which accommodates the capacitor 14 serving as an element is provided on an inner wall of the housing with a heat radiation sheet 20 interposed therebetween. Hereinafter, an end face of the first casing 16 at the downside in the vertical direction will be referred to as a "bottom face" and an end face thereof at the upside in the vertical direction will be referred to as a "top face".

In the embodiment, ten capacitors 14 are disposed in parallel inside the first casing 16 as indicated by the dashed line. For this reason, the first casing 16 includes a main body 22 which is formed in a substantially elongated rectangular parallelepiped shape, a first terminal block 24 which is provided at one end of the main body 22, and a second terminal block 26 which is provided at the other end thereof. The first terminal block 24 is formed in such a manner that a positive electrode terminal block 28 extending in the vertical direction is connected to a first negative electrode terminal block 30 which is slightly longer than the positive electrode terminal block 28. Meanwhile, the second terminal block 26 only includes a second negative electrode terminal block 32.

The positive electrode terminal block 28 accommodates a positive electrode terminal 34 formed of metal. Similarly, the first negative electrode terminal block 30 and the second negative electrode terminal block 32 also respectively accommodate a first negative electrode terminal 36 and a second negative electrode terminal 38 formed of metal. The positive electrode terminal 34, the first negative electrode terminal 36, and the second negative electrode terminal 38 are respectively provided with screw holes 40 and 42 directed from top faces toward bottom faces. Additionally, a screw hole of the positive electrode terminal 34 is not illustrated in the drawings.

The positive electrodes of the capacitors 14 are electrically connected to one another through a positive electrode busbar 46 having four positive electrode tab portions 44. Further, a positive electrode conductive plate (not illustrated) having a first tab portion connected to a positive electrode tab portion 44 is electrically connected to a positive electrode busbar 46. One end of the positive electrode conductive plate covers a top face of a positive electrode terminal block 28 and is positioned and fixed to a positive electrode terminal 34 through a screw threaded into the screw hole. Accordingly, positive electrodes of the capacitors 14 are electrically connected to the positive electrode terminal 34 through the positive electrode busbar 46 and the positive electrode conductive plate.

Similarly, the negative electrodes of the capacitors 14 are electrically connected to the first negative electrode terminal 36 and the second negative electrode terminal 38 through a negative electrode busbar 50 having four negative electrode tab portions 48 and a negative electrode conductive plate (not illustrated) including four second tab portions. That is, one end of a negative electrode conductive plate covers a top face of a first negative electrode terminal block 30 and is positioned and fixed to a first negative electrode terminal 36 through a screw threaded into the screw hole. Meanwhile, the other end thereof covers a top face of a second negative electrode terminal block 32 and is positioned and fixed to a second negative electrode terminal 38 through screws threaded into screw holes 40 and 42. As a result, negative electrodes of the capacitors 14 are electrically connected to the first negative electrode terminal 36 and the second negative electrode terminal 38 through a negative electrode busbar 50 and a negative electrode conductive plate.

A plurality of tongue piece portions 52 each having a through-hole are formed in a bottom face of the first casing 16 to protrude in the horizontal direction. Although not illustrated in detail, a screw passing through the through-hole is threaded into a screw hole formed in the housing 12 so that the first casing 16 is positioned and fixed.

At the positioning and fixing operation, the heat radiation sheet 20 is sandwiched between the bottom face of the first casing 16 and the housing 12. The heat radiation sheet 20 has high thermal conductivity. For this reason, heat generated from the capacitor 14 and transmitted to the first casing 16 is promptly transmitted to the housing 12 through the heat radiation sheet 20. In addition, the heat radiation sheet 20 is made of an insulation body.

The PCU 10 further includes a second casing 60 (see FIG. 1) separated from the first casing 16. The second casing 60 accommodates capacitors which are fewer than the capacitors 14 inside the first casing 16. The capacitors 14 inside the first casing 16 are electrically connected to the capacitors inside the second casing 60. Further, the capacitors 14 are electrically connected to first to fourth reactors 64a to 64d through a P-contactor 62 constituting the PCU 10.

First to fourth intelligent power modules (IPMs) 66a to 66d are disposed in a space formed between the first casing 16 and the first to fourth reactors 64a to 64d. The positive electrode tab portion 44 (see FIG. 3), the first tab portion, the negative electrode tab portion 48, and the second tab portion are electrically connected to the first to fourth IPMs 66a to 66d and the first to fourth IPMs 66a to 66d are electrically connected to the first to fourth reactors 64a to 64d through a current sensor 68a.

The PCU 10 further includes an N-contactor 70. The capacitors 14 inside the first casing 16 are also electrically connected to the N-contactor 70.

Additionally, the above-described electrical connection is made through a busbar, but the busbar is not illustrated in the drawings in order to easily understand a positional relation among components. Further, a current sensor 68b is interposed in the busbar connected to the second negative electrode terminal 38 and the N-contactor 70.

As illustrated in FIG. 2, a part of the bottom face of the housing 12 is bent toward the top face of the housing 12. For this reason, the housing 12 is formed in a shape provided with a concave portion 80. Then, a first accommodation space 82 is formed at the right side of the concave portion 80 and a second accommodation space 84 is formed at the upside of the concave portion 80 in FIG. 2 inside the housing 12. A convex member 86 is inserted into the concave portion 80.

The first casing 16 is disposed inside the first accommodation space 82 and is positioned and fixed to the bottom face of the housing 12 through the heat radiation sheet 20 as described above. That is, in the first accommodation space 82, the heat sink 18 does not sneak to the bottom face of the housing 12. For this reason, the first casing 16 does not contact the heat sink 18 and the first casing 16 and the heat sink 18 are separated from each other.

The housing 12 is provided with a cooling passage 88 through which cooling water CW serving as a cooling medium flows. As illustrated in FIG. 1, the cooling passage 88 sneaks to the vicinities of the second casing 60, the P-contactor 62, and the first to fourth reactors 64a to 64d through the vicinity of the first terminal block 24 of the first casing 16. Further, the cooling passage 88 is bent toward the second casing 60, is folded back in the vicinity of the second casing 60 to extend in the parallel direction of the first to fourth IPMs 66a to 66d and the longitudinal direction of a main body 22 of the first casing 16, and is bent in the vicinity of the N-contactor 70 to approach the vicinity of the second terminal block 26.

That is, the cooling passage 88 surrounds the first casing 16 from the three directions of the first terminal block 24, the main body 22, and the second terminal block 26. Further, a portion near the first terminal block 24 in the cooling passage 88 is located at the upstream side of the flow direction of the cooling water CW and a portion near the second terminal block 26 is located at the downstream side thereof.

Meanwhile, a part of the heat sink 18 is sandwiched between the convex member 86 and the concave portion 80 of the housing 12. Accordingly, the heat sink 18 is provided at the housing 12. The heat sink 18 has a bent portion corresponding to the shapes of the convex member 86 and the concave portion 80. For this reason, a highest face 18a located at the highest position of the heat sink 18 in the vertical direction is located at a position lower than the cooling passage 88. That is, the highest face 18a is located at a position lower than the cooling passage 88.

The first to fourth IPMs 66a to 66d are mainly disposed at the second accommodation space 84. That is, the first to fourth IPMs 66a to 66d face the cooling passage 88. Further, Reference Sign 90 of FIG. 2 indicates a circuit board.

The bottom face of the housing 12 of the first accommodation space 82 is located at a position lower than the bottom face of the housing 12 (the concave portion 80) of the second accommodation space 84. For this reason, a lowest face 16a of the first casing 16, that is, a bottom face located at the lowest position in the vertical direction is located at a position lower than the highest face 18a of the heat sink 18. That is, the lowest face 16a is located at a position lower than the highest face 18a of the heat sink 18.

As understood from the description above, since the cooling passage 88 is located at a position lower than the highest face 18a of the heat sink 18, the lowest face 16a of the first casing 16 is located at a position lower than the cooling passage 88. Further, although not illustrated in the drawings, the lowest face (the bottom face) of the second casing 60 is located at a position lower than the cooling passage 88 and the highest face 18a of the heat sink 18.

The arrangement structure according to the embodiment basically has the above-described configuration and the operation and effect thereof will be described below.

The PCU 10 including the capacitor 14 and the heat sink 18 is mounted on a so-called hybrid vehicle traveling by using, for example, both an internal combustion engine and a motor as travel driving sources and exhibits a function of controlling an output of a battery for driving the motor. Specifically, a voltage of a battery is increased or a DC voltage obtained from a battery is converted into an AC voltage.

Prior to a start of a control (a start of a supply of a current to elements), the cooling water CW flows through the cooling passage 88. As illustrated in FIG. 1, the cooling water CW passes through the vicinities of the first terminal block 24 of the first casing 16, the second casing 60 (the capacitor), the P-contactor 62, the first to fourth reactors 64a to 64d, the first to fourth IPMs 66a to 66d, the main body 22 of the first casing 16, the N-contactor 70, and the second terminal block 26 of the first casing 16. For this reason, heat generated from the elements in accordance with the start of the control of the PCU 10 is removed by the cooling water CW.

The first to fourth reactors 64a to 64d and the first to fourth IPMs 66a to 66d are provided on the heat sink 18. For this reason, heat generated from the first to fourth reactors 64a to 64d and the first to fourth IPMs 66a to 66d is promptly transmitted to the heat sink 18. On the contrary, the lowest face 16a of the first casing 16 contacts the bottom face of the housing 12 through the heat radiation sheet 20 and does not contact the heat sink 18. Thus, heat of the first casing 16 is not directly transmitted to the heat sink 18 and is indirectly transmitted thereto through the heat radiation sheet 20 and the housing 12.

Here, the cooling passage 88 and the highest face 18a of the heat sink 18 are located at positions higher than the lowest face 16a of the first casing 16 as described above (see FIG. 2). Since the heat sink 18 radiates heat, the cooling water CW flows to the highest face 18a of the heat sink 18. Accordingly, it is possible to suppress an increase in temperature of the atmosphere in the periphery of the highest face 18a of the heat sink 18 and the cooling passage 88 in the second accommodation space 84. Meanwhile, the temperature of the atmosphere in the vicinity of the lowest face 16a of the first casing 16 in the first accommodation space 82 relatively increases in accordance with the radiation of heat of the capacitor 14 inside the first casing 16.

That is, the temperature of the atmosphere at the high position (the second accommodation space 84) inside the housing 12 easily becomes low and the temperature of the atmosphere at the low position (the first accommodation space 82) easily becomes high. Then, the low-temperature atmosphere tends to move to a low position and the high-temperature atmosphere tends to move to a high position. For this reason, a flow of the atmosphere is formed from the highest face 18a of the heat sink 18 and the cooling passage 88 toward the lowest face 16a of the first casing 16 inside the housing 12.

By this flow, the first casing 16 is cooled. That is, since the heat of the first casing 16 is removed, an excessive increase in temperature inside the capacitor 14 is prevented. For this reason, the functions of the capacitors 14 are kept.

In this way, in the embodiment, the lowest face 16a of the first casing 16 having a relatively high temperature is located at a position lower than the highest face 18a of the heat sink 18 and the cooling passage 88 having a relatively low temperature. For this reason, a flow of the atmosphere toward the first casing 16 is formed inside the housing 12. Furthermore, since the first casing 16 is surrounded by the cooling passage 88 in the three directions, the atmosphere flows in three directions from the first terminal block 24, the main body 22, and the second terminal block 26 to the vicinity of the lowest face 16a of the first casing 16.

Due to the flow of the atmosphere, the heat of the first casing 16 and the capacitor 14 is promptly removed. Thus, the bottom face (the lowest face 16a) of the first casing 16 can be directly brought into contact with the bottom face of the housing 12 as illustrated in FIG. 2. Even in this case, an excessive increase in temperature of the first casing 16 (the capacitor 14) can be sufficiently suppressed.

Thus, there is no need to cause a contact between the bottom face of the first casing 16 and the heat sink 18. In other words, there is no need to provide the first casing 16 on the heat sink 18. Thus, the height (the thickness) from the bottom face of the housing 12 to the top face of the first casing 16 can be decreased by the thickness of the heat sink 18. Although there is no particular description, the same applies to the second casing 60. Accordingly, since the first accommodation space 82 can be narrowed, the housing 12 and the PCU 10 can be also decreased in size.

For this reason, a space for installing the PCU 10 can be narrowed. Thus, the degree of freedom in the arrangement layout of the mounting devices like the PCU 10 is improved even in a small-size vehicle having a limited mounting space.

The invention is not limited to the above-described embodiments and various modifications can be made without departing from the spirit of the invention.

For example, the cooling passage 88 may be formed in the heat sink 18 instead of the housing 12.

Further, the above-described arrangement structure is not limited to the PCU 10 and can be widely applied to a configuration including the capacitor 14 and the heat sink 18.

According to the embodiment of the invention, there is provided a capacitor arrangement structure that accommodates a casing accommodating a capacitor inside a hollow housing and provides a heat sink at a position separated from the casing in the housing, wherein a lowest face located at the lowest position of the casing in the vertical direction is located below a highest face located at the highest position of the heat sink in the vertical direction.

The heat sink radiates heat transmitted from various elements. For this reason, the atmosphere at the highest face of the heat sink has a relatively low temperature. Meanwhile, the lowest face of the casing has a relatively high temperature due to the heat radiated from the capacitor. That is, the atmosphere in the vicinity of the highest face of the heat sink at the high position (the upside) has a relatively low temperature and the atmosphere in the vicinity of the lowest face of the casing at the lowest position (the downside) has a relatively high temperature.

Thus, in this case, a flow of the atmosphere having a relatively low temperature toward the lowest face is formed. By this flow, the heat of the casing and the capacitor is promptly removed. In other words, an excessive increase in temperature of the casing and the capacitor is prevented and a predetermined function of the capacitor is kept.

For this reason, the lowest face of the casing can be arranged not to contact the heat sink. That is, there is no need to position and fix the casing onto the heat sink. In other words, there is no need to interpose the heat sink between the housing and the casing. By this amount, the height (the thickness) including the housing and the casing can be decreased.

Thus, the height of the component including the capacitor can be easily decreased. Further, the housing can be easily decreased in size. For this reason, since a decrease in size of, for example, the PCU can be realized, the PCU can be easily mounted onto even a small-size vehicle having a narrow space. Furthermore, the degree of freedom in the arrangement layout of the mounting in-vehicle device including the PCU is improved.

In addition to the above-described configuration, when a cooling passage through which a cooling medium flows is formed inside the housing, it is desirable to set the cooling passage at the upside in relation to the lowest face of the casing. In this case, since the atmosphere in the periphery of the cooling passage also has a relatively low temperature, a flow of the atmosphere from the cooling passage toward the casing is easily formed.

That is, in this case, a flow from the cooling passage is added to a flow from the heat sink. For this reason, the casing and the capacitor can be further efficiently cooled.

The cooling passage may be provided to surround the casing. In this case, the atmosphere flows from the vicinity of the cooling passage surrounding the casing to the casing. That is, the amount of the flow increases. Furthermore, the heat of the casing is removed from the cooling medium. Thus, the casing can be further efficiently cooled.

From the viewpoint of the easy formation or the efficiency of the cooling passage, it is desirable to form the cooling passage in the housing. That is, in this case, the cooling passage can be easily and efficiently formed.

According to the embodiment, the highest face of the heat sink is located above the lowest face of the casing accommodating the capacitor (to be located at the high position). For this reason, the atmosphere having a relative low temperature in the vicinity of the highest face of the heat sink easily flows toward the lowest face of the casing having a relatively high temperature due to the heat radiated from the capacitor. As a result of such a flow, the heat of the casing and the capacitor is promptly removed. Accordingly, an excessive increase in temperature thereof is prevented. Thus, a predetermined function of the capacitor is kept.

For this reason, the lowest face of the casing can be brought into contact with the housing accommodating the casing instead of the heat sink. That is, since there is no need to interpose the heat sink between the housing and the casing, the height (the thickness) including the housing and the casing can be decreased. Accordingly, a decrease in size of the housing can be realized.

Obviously, numerous modifications and variations of the present invention are possible in light of the above teachings. It is therefore to be understood that within the scope of the appended claims, the invention may be practiced otherwise than as specifically described herein.

What is claimed is:

1. A capacitor arrangement structure comprising:
a casing to accommodate a capacitor, the casing including a casing bottom;
a housing including a bottom wall and having a height from the bottom wall which includes an inner surface and an outer surface opposite to the inner surface in a height direction along the height, the casing being mounted on the inner surface so that the casing bottom opposes a mounting surface in the inner surface;
a heat sink including a heat sink top and provided on the outer surface of the bottom wall not to overlap the casing viewed along the height direction, the heat sink top opposing the outer surface; and
a distance between the casing bottom and the mounting surface in the height direction being smaller than a distance between the heat sink top and the mounting surface in the height direction.

2. The capacitor arrangement structure according to claim 1,
wherein the casing bottom surface is contacting with the inner surface via a heat radiation sheet.

3. The capacitor arrangement structure according to claim 1,
wherein a cooling passage through which a cooling medium flows is disposed inside the housing and the cooling passage is located at a position higher than the casing bottom surface of the casing.

4. The capacitor arrangement structure according to claim 3,
wherein the casing is surrounded by the cooling passage.

5. The capacitor arrangement structure according to claim 4,
wherein the cooling passage is formed in the housing.

* * * * *